US008248047B2

(12) United States Patent  
Zhou

(10) Patent No.: US 8,248,047 B2
(45) Date of Patent: Aug. 21, 2012

(54) POWER SUPPLY CIRCUIT

(75) Inventor: Hai-Qing Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 471 days.

(21) Appl. No.: 12/638,855

(22) Filed: Dec. 15, 2009

(65) Prior Publication Data

US 2011/0095743 A1    Apr. 28, 2011

(30) Foreign Application Priority Data

Oct. 22, 2009  (CN) .......................... 2009 1 0308638

(51) Int. Cl.
*G05F 1/40*         (2006.01)

(52) U.S. Cl. ..................................................... 323/271
(58) Field of Classification Search .................. 323/267, 323/268, 271, 282, 283, 285; 713/300, 320
See application file for complete search history.

(56) References Cited

U.S. PATENT DOCUMENTS

| 7,990,124 B2* | 8/2011 | Hu ................................. 323/283 |
| 2011/0310522 A1* | 12/2011 | Zhou et al. ..................... 361/103 |

* cited by examiner

*Primary Examiner* — Matthew Nguyen
(74) *Attorney, Agent, or Firm* — Altis Law Group, Inc.

(57) ABSTRACT

A power supply circuit arranged in a circuit board to supply a determined voltage to an element is disclosed. The power supply circuit includes a single-phase pulse width modulation (PWM) signal controller, two transistors, two field-effect transistors (FETs), and two inductors. The PWM signal controller is triggered via the two transistors and respectively alternately outputs a high level voltage signal and a low level voltage signal to alternately control the two FETs to be turned on and turned off, to output the determined voltage.

9 Claims, 1 Drawing Sheet

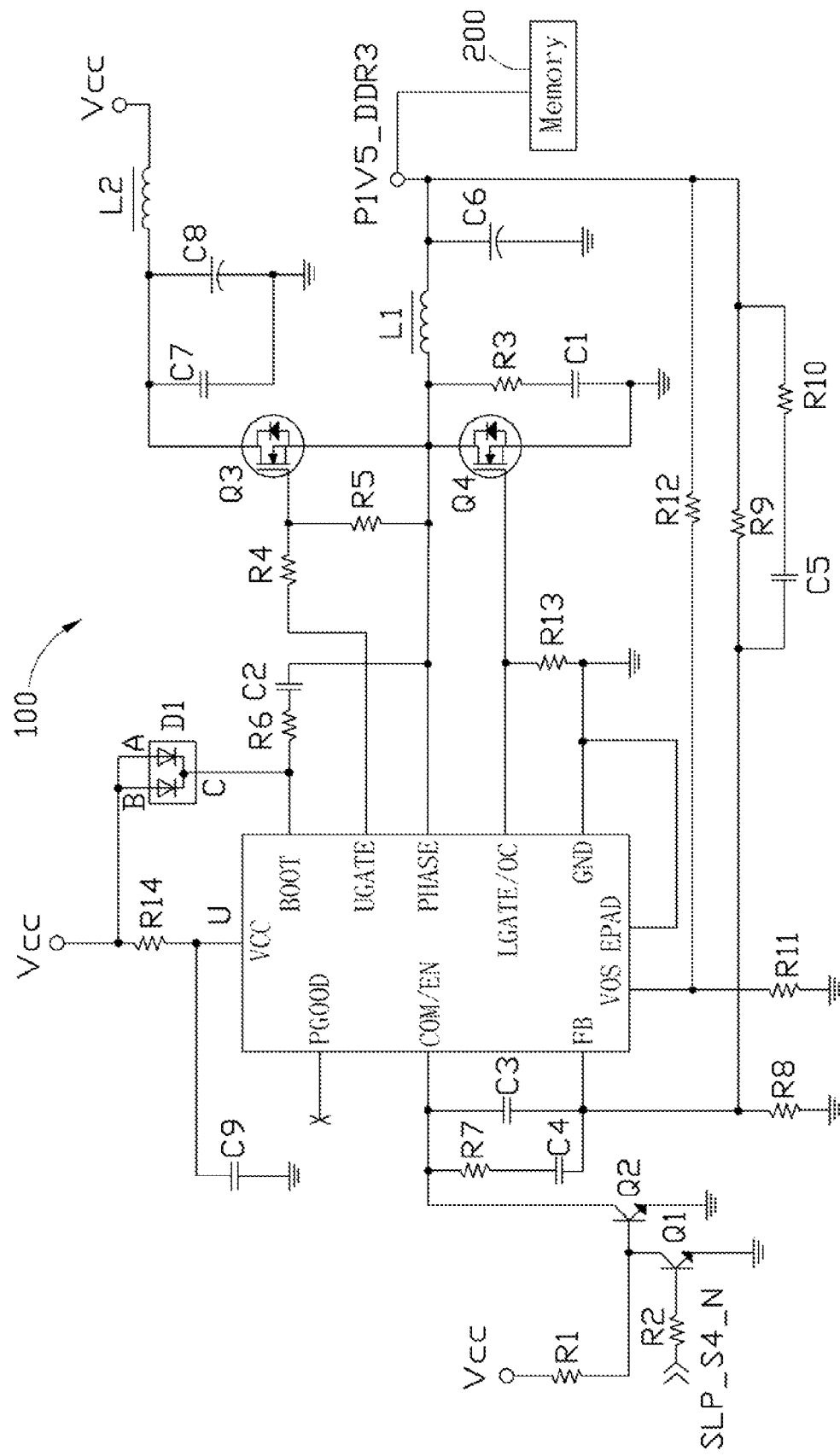

POWER SUPPLY CIRCUIT

BACKGROUND

1. Technical Field

The present disclosure relates to power supply circuits and, particularly, to a power supply circuit to supply a voltage to an element of a circuit board.

2. Description of Related Art

Most motherboards include memory chips. Power supply circuits are used to provide voltages to the memory chips. These power supply circuits may include some voltage converting chips. However, these voltage converting chips are very expensive and complicated.

BRIEF DESCRIPTION OF THE DRAWING

The drawing is a circuit diagram of an exemplary embodiment of a power supply circuit.

DETAILED DESCRIPTION

Referring to the drawing, an exemplary embodiment of a power supply circuit 100 is arranged in a motherboard to supply a 1.5 volts (V) voltage to an element, such as a memory 200. The power supply circuit 100 includes a single-phase pulse width modulation (PWM) signal controller U, two npn transistors Q1 and Q2, two n-channel metal-oxide semiconductor field-effect transistors (NMOSFETs) Q3, Q4, fourteen resistors R1-R14, nine capacitors C1-C9, two inductors L1, L2, a diode device D1, and a 5 V power supply Vcc. In one embodiment, the PWM signal controller U is an ISL6341CRZ single-phase PWM signal controller. The diode device D1 is a BAT54C diode device including two parallel diodes. The memory 200 may be a double data rate 3 (DDR3) memory.

An enable pin COM/EN of the PWM signal controller U is connected to a collector of the transistor Q2. An emitter of the transistor Q2 is grounded. A base of the transistor Q2 is connected to a collector of the transistor Q1 and connected to the power supply Vcc via the resistor R1. An emitter of the transistor Q1 is grounded. A base of the transistor Q1 is connected to an enable control signal receiving terminal SLP_S4_N via the resistor R2, to receive an enable control signal. The enable pin COM/EN of the PWM signal controller U is also connected to a feedback pin FB of the PWM signal controller U via the capacitor C3.

A first terminal of the resistor R7 is connected to the enable pin COM/EN of the PWM signal controller U. A second terminal of the resistor R7 is connected to the feedback pin FB of the PWM signal controller U via the capacitor C4. The feedback pin FB of the PWM signal controller U is grounded via the resistor R8, and connected to a voltage output terminal P1V5_DDR3 via the resistor R9. The voltage output terminal P1V5_DDR3 is used to connect to the memory 200 to provide the 1.5V voltage to the memory 200. A detecting pin VOS of the PWM signal controller U is grounded via the resistor R11, and connected to the voltage output terminal P1V5_DDR3 via the resistor R12. A first terminal of the capacitor C5 is connected to a node between the resistor R9 and the feedback pin FB of the PWM signal controller U. A second terminal of the capacitor C5 is connected to a node between the resistor R9 and the voltage output terminal P1V5-DDR3 via the resistor R10. The capacitor C6 is connected between the voltage output terminal P1V5_DDR3 and ground.

A power pin VCC of the PWM signal controller U is connected to the power supply Vcc via the resistor R14 and grounded via the capacitor C9. A boot pin BOOT of the PWM signal controller U is connected to a cathode C of the diode device D1. Two anodes A, B of the diode device D1 are connected to the power supply Vcc. The boot pin BOOT is also connected a first terminal of the resistor R6. A second terminal of the resistor R6 is connected to a phase pin PHASE of the PWM signal controller U via the capacitor C2. The phase pin PHASE of the PWM signal controller U is connected to the voltage output terminal P1V5_DDR3 via the inductor L1, and connected to a first terminal of the resistor R3. A second terminal of the resistor R3 is grounded via the capacitor C1. A high-pass driving pin UGATE of the PWM signal controller U is connected to a gate of the FET Q3 via the resistor R4. A drain of the FET Q3 is connected to the power supply Vcc via the inductor L2. The capacitor C7 is connected between the drain of the FET Q3 and ground. The capacitor C8 is connected between the drain of the FET Q3 and ground.

A source of the FET Q3 is connected to a drain of the FET Q4 and the phase pin PHASE of the PWM signal controller U. The gate of the FET Q3 is also connected to the drain of the FET Q4 via the resistor R5. A low-pass driving pin LGATE/OC of the PWM signal controller U is connected to a gate of the FET Q4. A source of the FET Q4 is grounded. The low-pass driving pin LGATE/OC of the PWM signal controller U is also grounded via the resistor R13. A ground pin GND and a data pin EPAD of the PWM signal controller U are both grounded.

In use, when the enable control signal receiving terminal SLP_S4_N receives a low voltage level signal, such as 0V voltage, that means the motherboard is in an S4 status (in S4 status, memories and hard disk drives of the motherboard are not powered). The transistor Q1 is turned off, and the transistor Q2 is turned on. The enable pin COM/EN of the PWM signal controller U is at a low voltage status, therefore the PWM signal controller U is inactive.

When the enable control signal receiving terminal SLP_S4_N receives a high voltage level signal, such as 5V voltage, that means the motherboard is not in the S4 status. The transistor Q1 is turned on, and the transistor Q2 is turned off. The enable pin COM/EN of the PWM signal controller U is at a high voltage status, therefore the PWM signal controller U becomes activated. The high-pass driving pin UGATE of the PWM signal controller U outputs a high level voltage signal and a low level voltage signal in an alternating order to control the FET Q3 to turn on and turn off repeatedly. Furthermore the low-pass driving pin LGATE of the PWM signal controller U alternately outputs a low level voltage signal and a high level voltage signal to alternately control the FET Q4 to be turned off and turned on. As a result, the FET Q3 and the FET Q4 are at different states at any given time. At the same time, the phase pin PHASE of the PWM signal controller U outputs a PWM signal to a first terminal of the inductor L1 and the power supply Vcc outputs a 5 V voltage to the first terminal of the inductor L1 via the capacitor C2, the resistor R6, and the diode device D1, and then a second terminal of the inductor L1 outputs the 1.5V voltage to the voltage output terminal P1V5_DDR3 to supply the 1.5V voltage to the memory 200.

The 1.5V voltage is also fed back to the feedback pin FB of the PWM signal controller U via the resistors R9, R8, to adjust output signals from the high-pass driving pin UGATE, the low-pass driving pin LGATE, and the phase pin PHASH of the PWM signal controller U, to stabilize the 1.5V voltage.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A power supply circuit to supply a determined voltage to an element, the power supply circuit comprising:

a single-phase pulse width modulation (PWM) signal controller;

a first transistor and a second transistor, wherein an enable pin of the PWM signal controller is connected to a collector of the second transistor, an emitter of the second transistor is grounded, a base of the second transistor is connected to a collector of the first transistor and connected to a power supply via a first resistor; an emitter of the first transistor is grounded, a base of the first transistor is connected to an enable control signal receiving terminal via a second resistor to receive an enable control signal;

a first field-effect transistor (FET) and a second FET; and a first inductor and a second inductor, wherein a phase pin of the PWM signal controller is connected to a voltage output terminal via the first inductor to output the determined voltage, the phase pin of the PWM signal controller is also connected to a first terminal of a third resistor, a second terminal of the third resistor is grounded via a first capacitor, a high-pass driving pin of the PWM signal controller is connected to a gate of the first FET via a fourth resistor, a drain of the first FET is connected to the power supply via the second inductor, a source of the first FET is connected to a drain of the second FET and the phase pin of the PWM signal controller, the gate of the first FET is also connected to the drain of the second FET via a fifth resistor, a low-pass driving pin of the PWM signal controller is connected to a gate of the second FET, a source of the second FET is grounded;

wherein the first transistor is turned on and the second transistor is turned off in response to the enable control signal receiving terminal receiving the enable control signal, the high-pass driving pin of the PWM signal controller outputs a high level voltage signal and a low level voltage signal in an alternating order to control the first FET to turn on and turn off repeatedly, the low-pass driving pin of the PWM signal controller outputs a low level voltage signal and a high level voltage signal in an alternating order to control the second FET to turn off and turn on repeatedly, the phase pin of the PWM signal controller outputs a PWM signal to a first terminal of the first inductor, and the power supply outputs a first voltage to the first terminal of the first inductor via a second capacitor and a sixth resistor in turn, and then a second terminal of the second inductor outputs the determined voltage to the voltage output terminal.

2. The power supply circuit of claim 1, wherein the enable pin of the PWM signal controller is also connected to a feedback pin of the PWM signal controller via a third capacitor, a first terminal of a seventh resistor is connected to the enable pin of the PWM signal controller, a second terminal of the second resistor is connected to the feedback pin of the PWM signal controller via a fourth capacitor, the feedback pin of the PWM signal controller is grounded via an eighth resistor and connected to the voltage output terminal via a ninth resistor, a first terminal of a fifth capacitor is connected to a first terminal of the ninth resistor, a second terminal of the fifth capacitor is connected to a second terminal of the ninth resistor and the voltage output terminal via a tenth resistor.

3. The power supply circuit of claim 2, wherein a detecting terminal of the PWM signal controller is grounded via an eleventh resistor and connected to the voltage output terminal via a twelfth resistor, a sixth capacitor is connected between the voltage output terminal and ground.

4. The power supply circuit of claim 3, wherein a boot pin of the PWM signal controller is connected to the phase pin of the PWM signal controller via the sixth resistor and the second capacitor in turn.

5. The power supply circuit of claim 4, wherein a diode device is connected between the sixth resistor and the power supply, a cathode of the diode device is connected to a node between the sixth resistor and the boot pin of the PWM signal controller, an anode of the diode device is connected to the power supply.

6. The power supply circuit of claim 5, wherein a seventh capacitor is connected between the drain of the second FET and ground, an eighth capacitor is connected between the drain of the second FET and ground.

7. The power supply circuit of claim 6, wherein the low-pass driving pin of the PWM signal controller is also connected to a ground pin of the PWM signal controller via a thirteenth resistor, and grounded.

8. The power supply circuit of claim 7, wherein a power pin of the PWM signal controller is connected to the power supply via a fourteenth resistor and grounded via a ninth capacitor.

9. The power supply circuit of claim 1, wherein the power supply is a 5 volt power supply.

* * * * *